United States Patent [19]

Saidian

[11] Patent Number: 5,532,557
[45] Date of Patent: * Jul. 2, 1996

[54] ELECTRIC LIGHT SOCKET CONSTRUCTIONS

[76] Inventor: Jacob Saidian, 440 El Rio Rd., Danville, Calif. 94526

[ * ] Notice: The portion of the term of this patent subsequent to May 4, 2010, has been disclaimed.

[21] Appl. No.: 42,529

[22] Filed: Apr. 5, 1993

Related U.S. Application Data

[63] Continuation-in-part of Ser. No. 719,355, Jun. 24, 1991, Pat. No. 5,208,516.

[51] Int. Cl.$^6$ .............................. H05B 37/00; H01J 7/44
[52] U.S. Cl. .................... 315/362; 315/194; 315/74; 315/51; 315/53; 439/56; 439/910; 439/168; 439/487; 323/904; 323/905; 307/116; 307/157
[58] Field of Search ............................... 315/362, 185 R, 315/201, 294, 307, 299, 51, 53, 72, 74; 307/116, 157; 323/904, 905; 439/910, 56, 161, 168, 487

[56] References Cited

U.S. PATENT DOCUMENTS

| | | | |
|---|---|---|---|
| 3,300,711 | 1/1967 | Duncan | 323/905 |
| 3,452,214 | 6/1969 | Martin | 307/96 |
| 3,496,451 | 2/1970 | Duncan | 323/905 |
| 3,666,988 | 5/1972 | Bellis | 315/362 |
| 3,715,623 | 2/1973 | Szabo | 315/194 |
| 4,101,805 | 7/1978 | Stone | 315/74 |
| 4,152,629 | 5/1979 | Raupp | 315/362 |
| 4,163,923 | 8/1979 | Herbers et al. | 315/208 |
| 4,211,959 | 7/1980 | Deavenport | 315/362 |
| 4,289,972 | 9/1981 | Wern | 315/362 |
| 4,613,790 | 9/1986 | Roorda | 315/72 |
| 4,764,708 | 8/1988 | Roudeski | 315/362 |
| 4,816,698 | 3/1989 | Hook | 315/362 |
| 5,015,924 | 5/1991 | Berman et al. | 315/324 |
| 5,066,896 | 11/1991 | Bertenshaw | 315/291 |
| 5,208,516 | 5/1993 | Saidian | 315/362 |

OTHER PUBLICATIONS

Holt Integrated Circuits, Inc. "HI–2410, 17 Capacitive Touch Light Dimmer Circuits" 3 unnumbered catalog pages, date not known.

Primary Examiner—Robert J. Pascal
Assistant Examiner—Arnold Kinkead
Attorney, Agent, or Firm—Harris Zimmerman

[57] ABSTRACT

Light socket improvements include a thermal conductor which removes heat by inducing a flow of air within the socket and/or which acts as heat sink that more efficiently transfers heat to the socket support thereby enabling use of higher wattage light bulbs. The conductor may, if desired, also function as a control signal input. Other improvements simplify wiring procedures and assure safety by providing a lockable internal chamber for power terminals within the socket housing. Some embodiments of the invention include electronic control circuits and enable selection of any of a variety of modes of controlling the light sockets by touch or by other forms of signal input including remote control and optional joint or independent control of individual sockets in a light fixture which has a plurality of sockets.

20 Claims, 11 Drawing Sheets

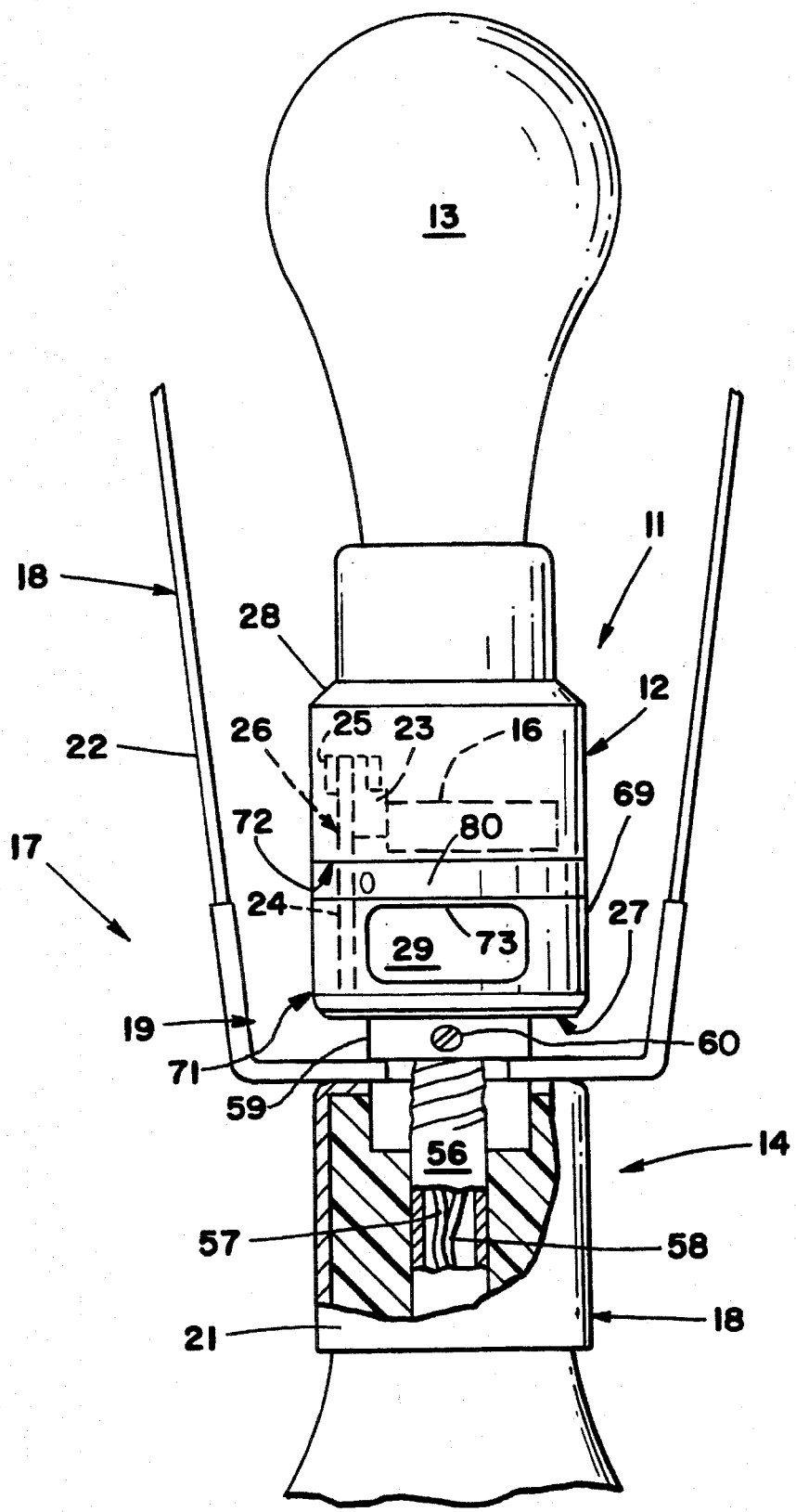
FIG_1

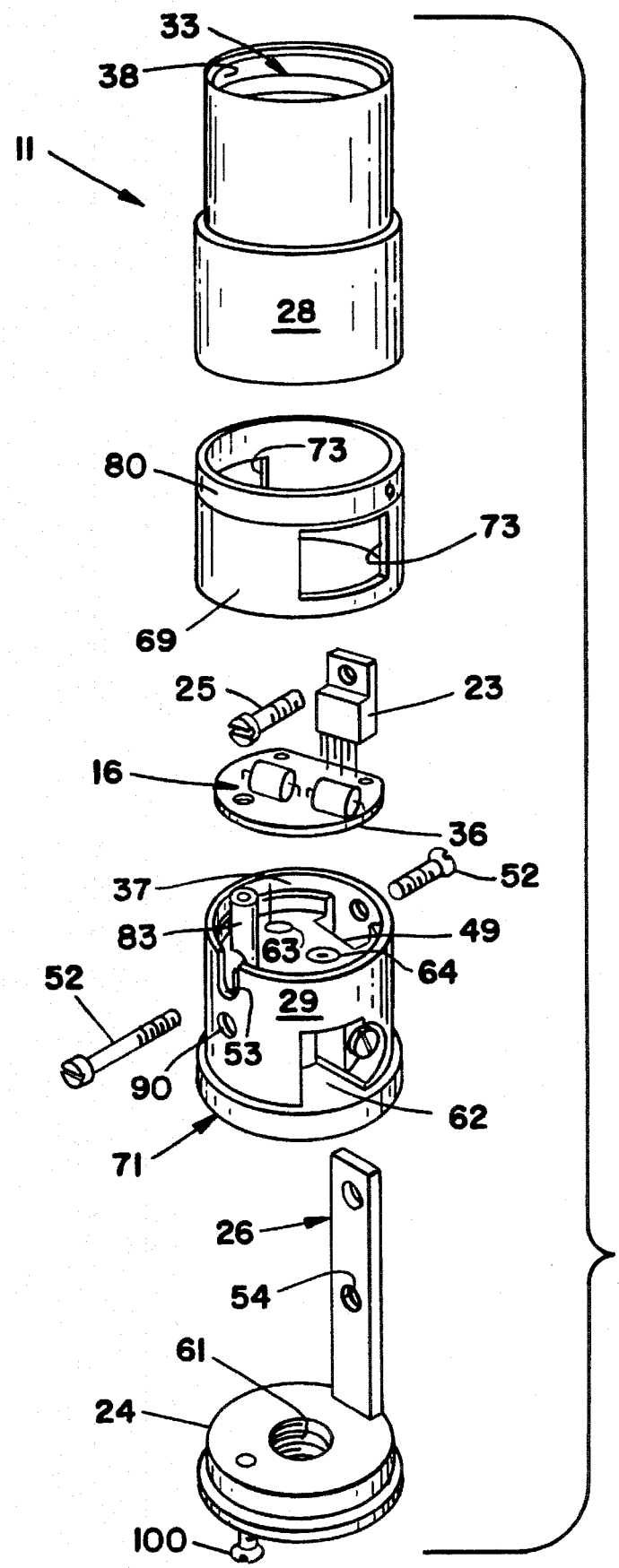
FIG_2

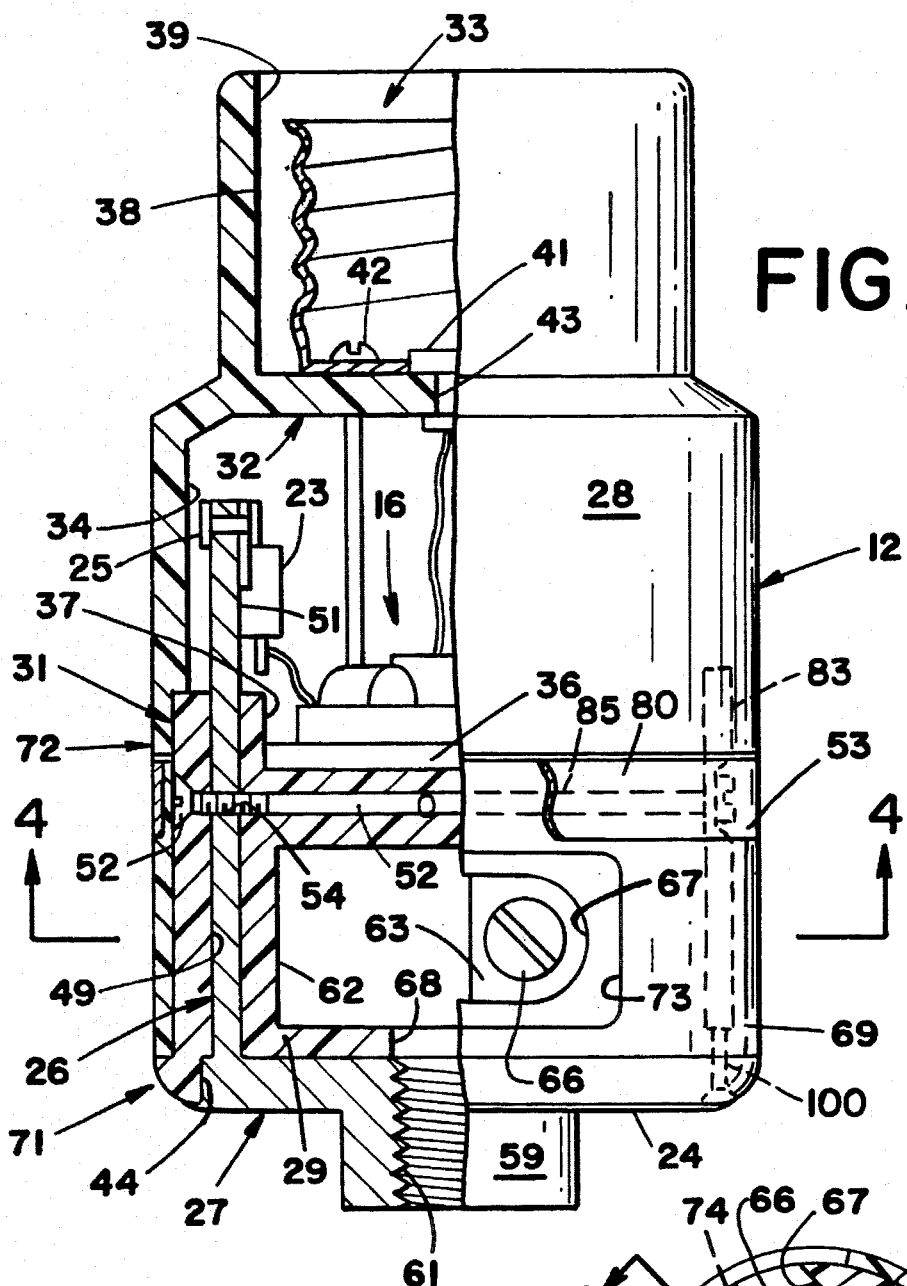
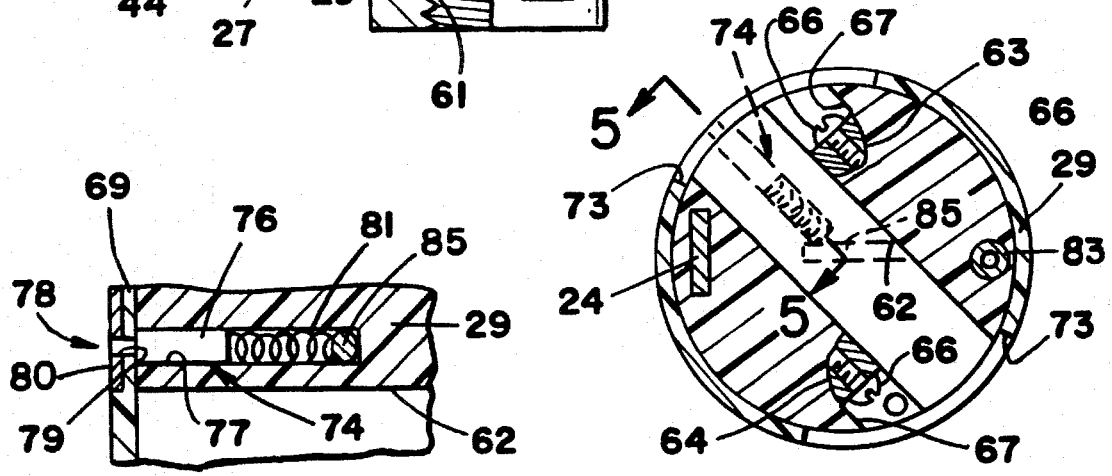
FIG_3
FIG_5     FIG_4

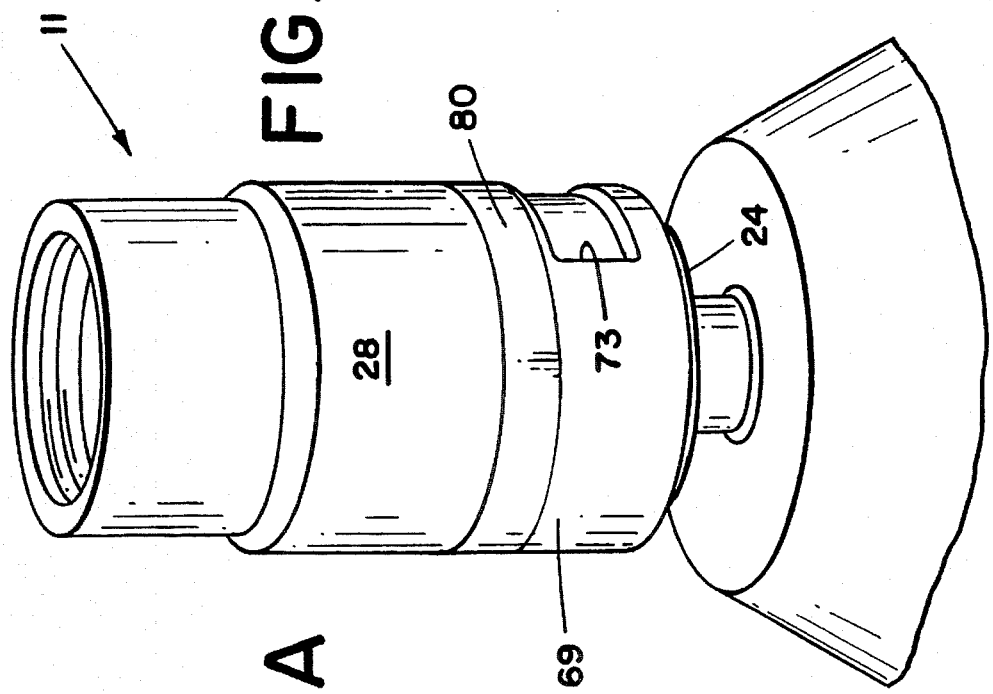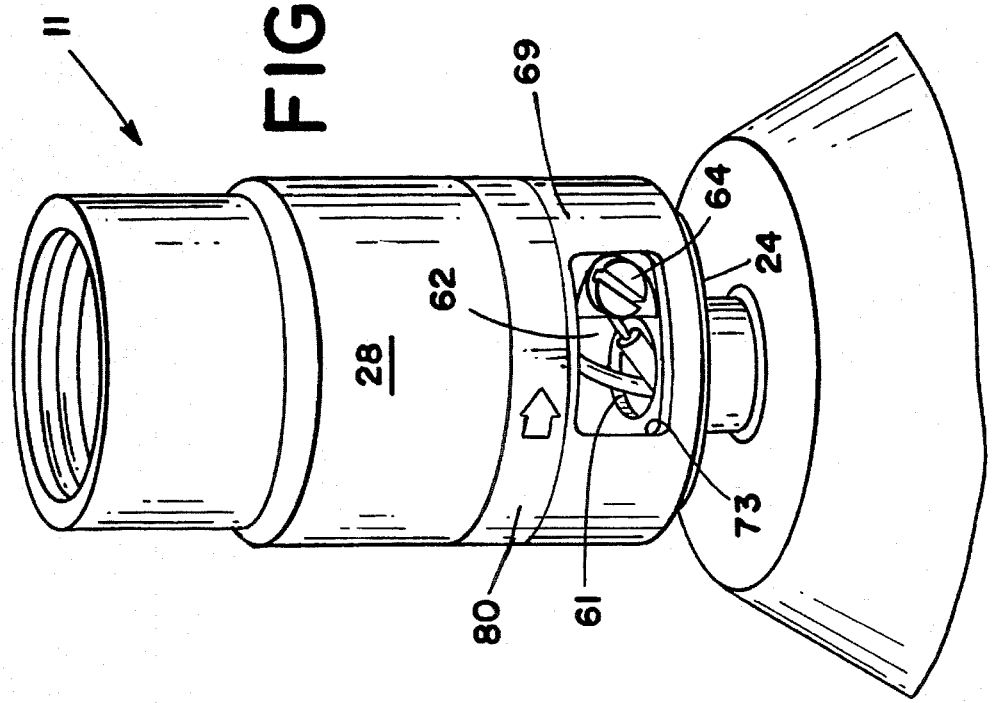

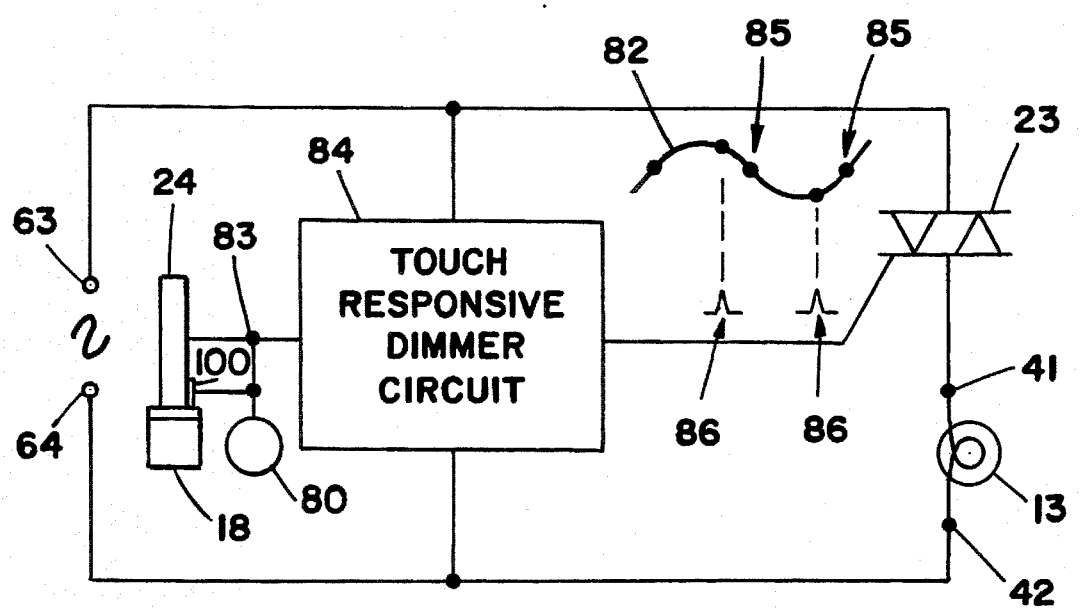
FIG_7
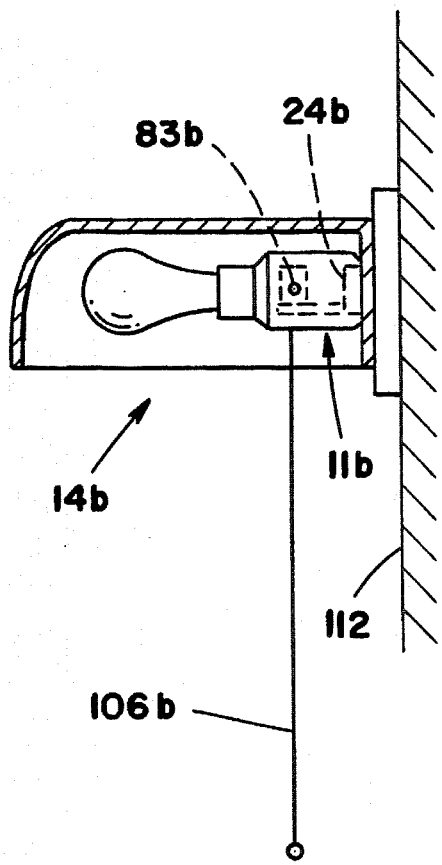
FIG_10

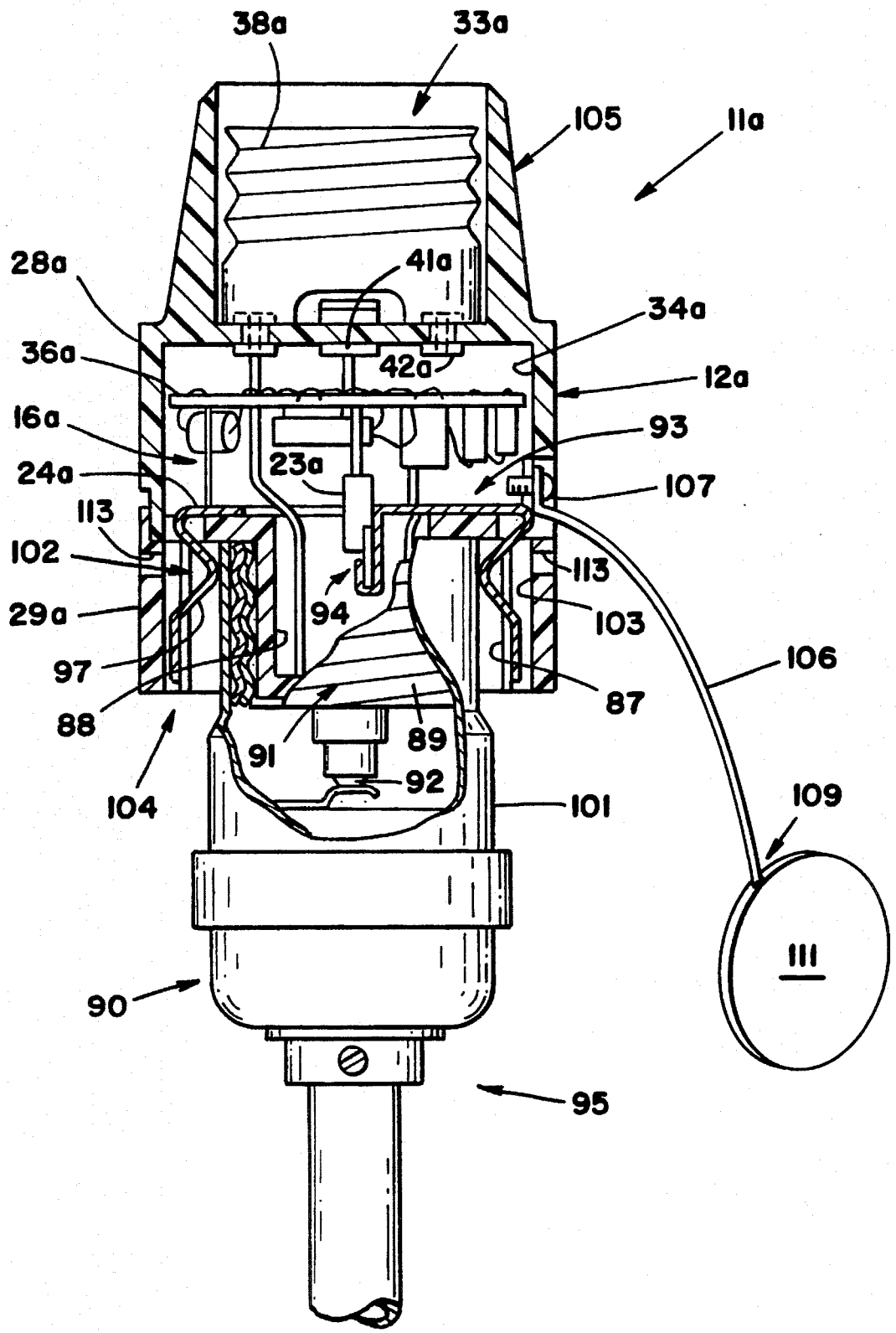
FIG_8

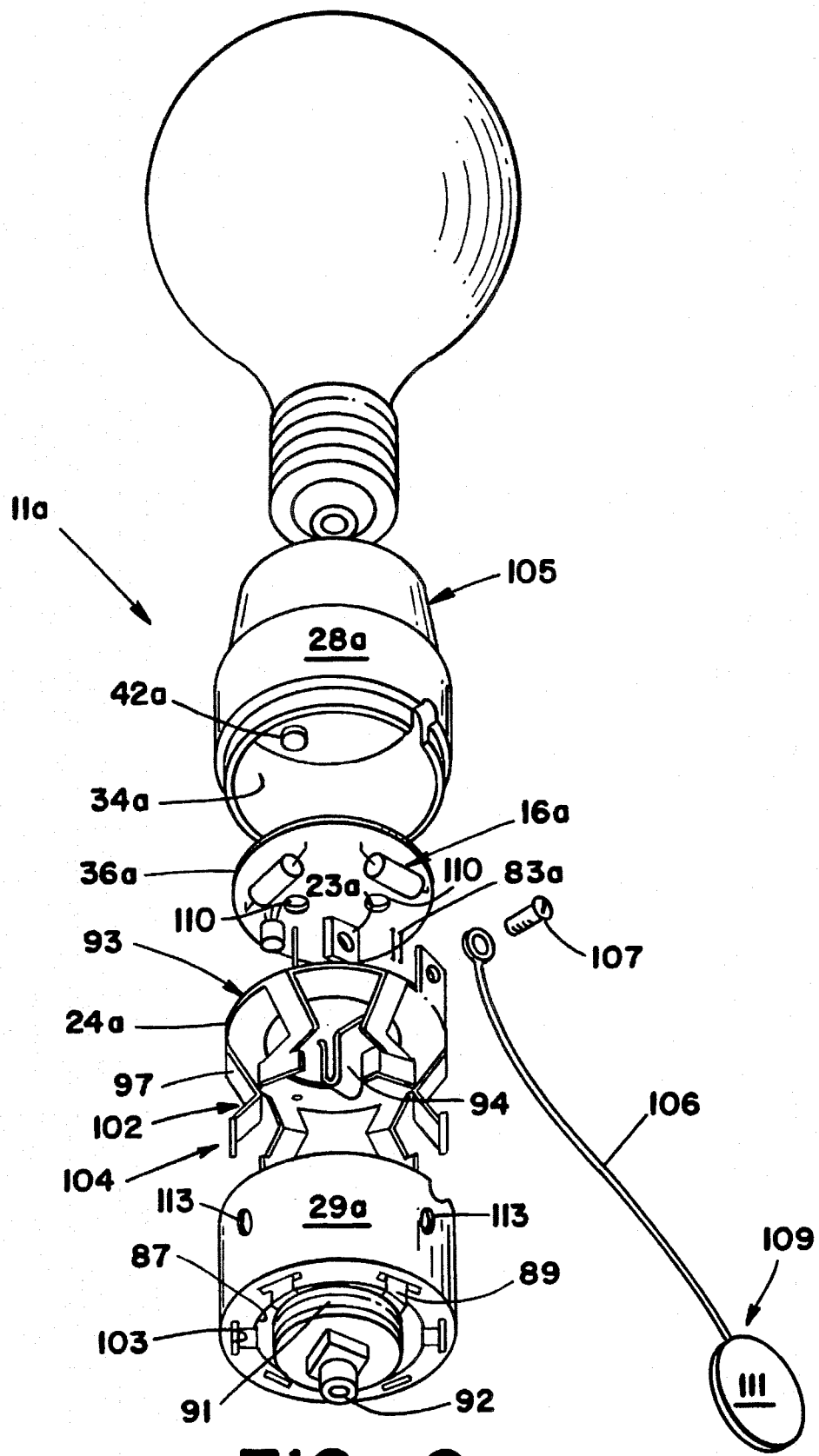
FIG_9

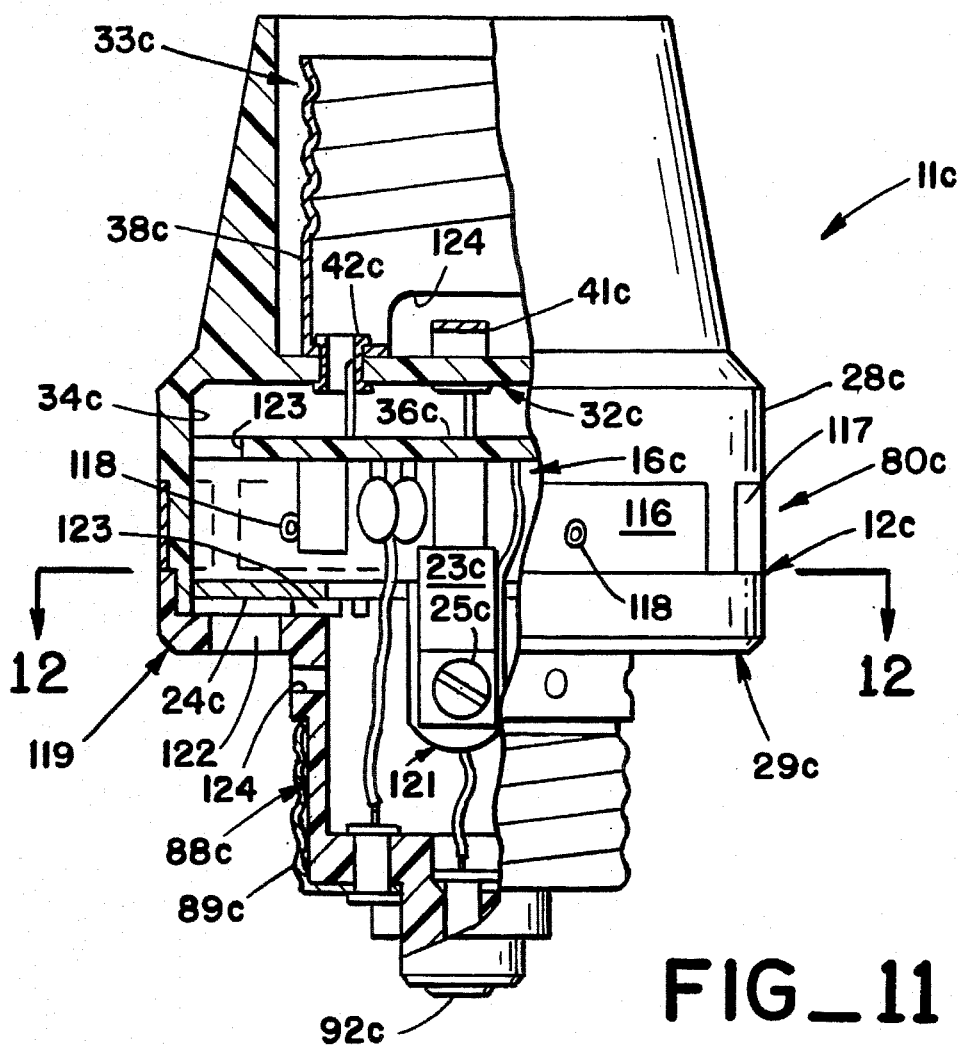
FIG_11
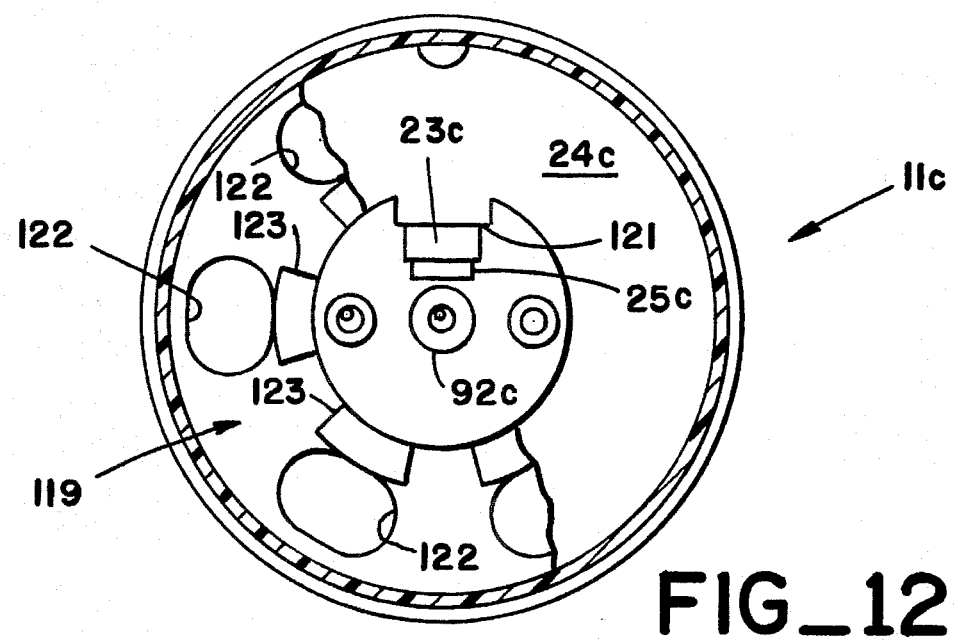
FIG_12

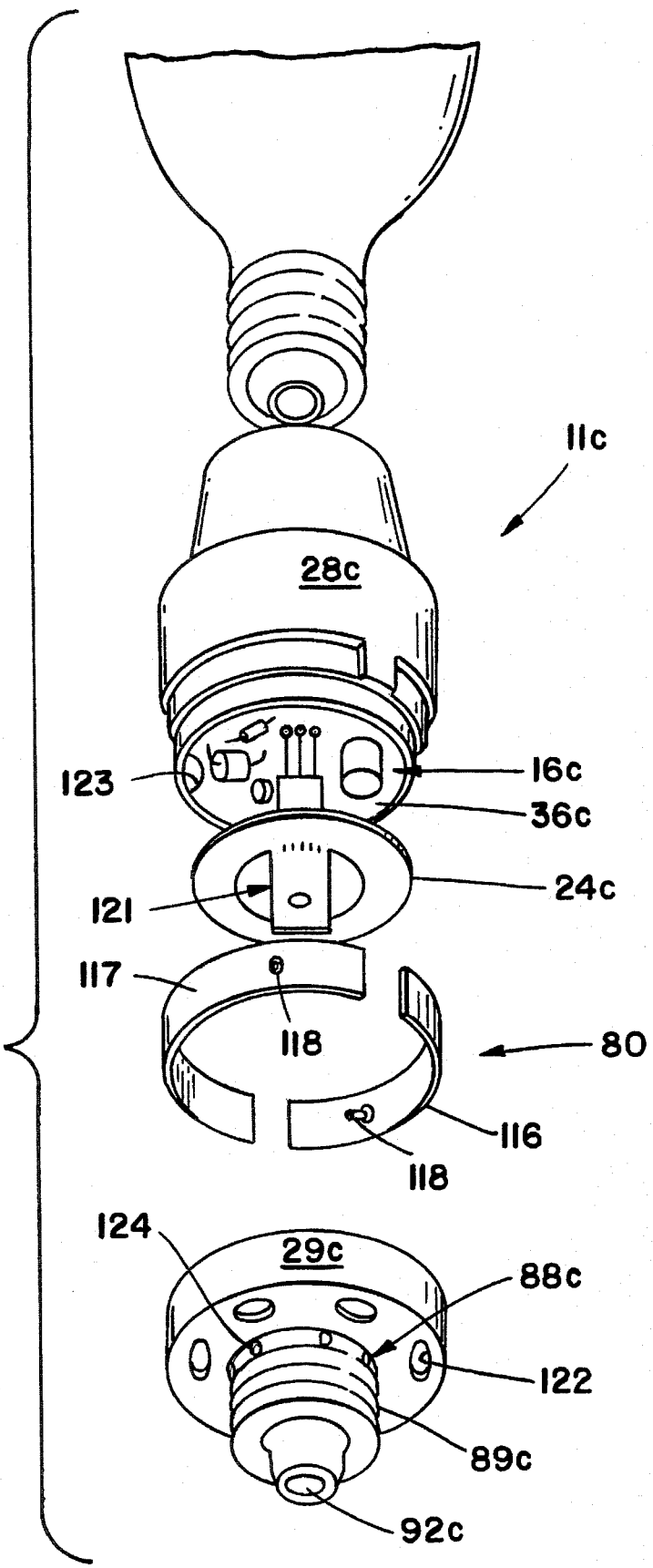
FIG_13

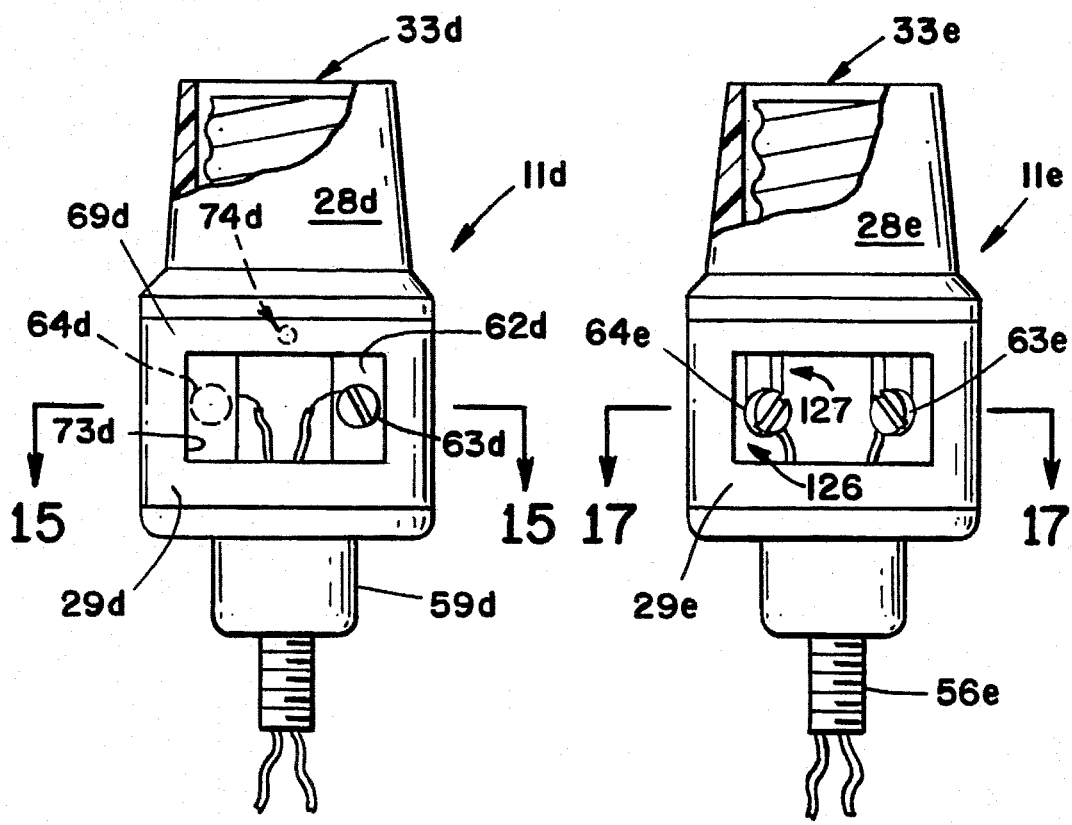
FIG_14    FIG_16
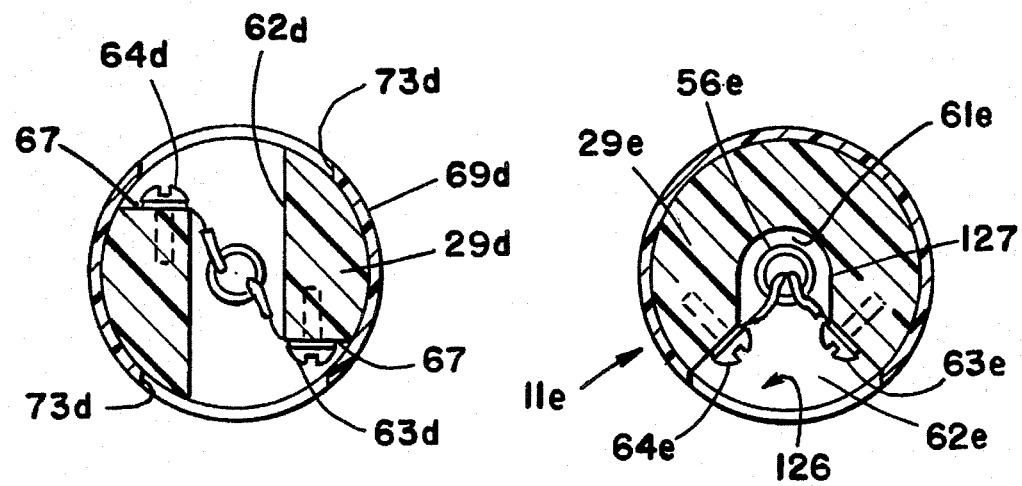
FIG_15    FIG_17

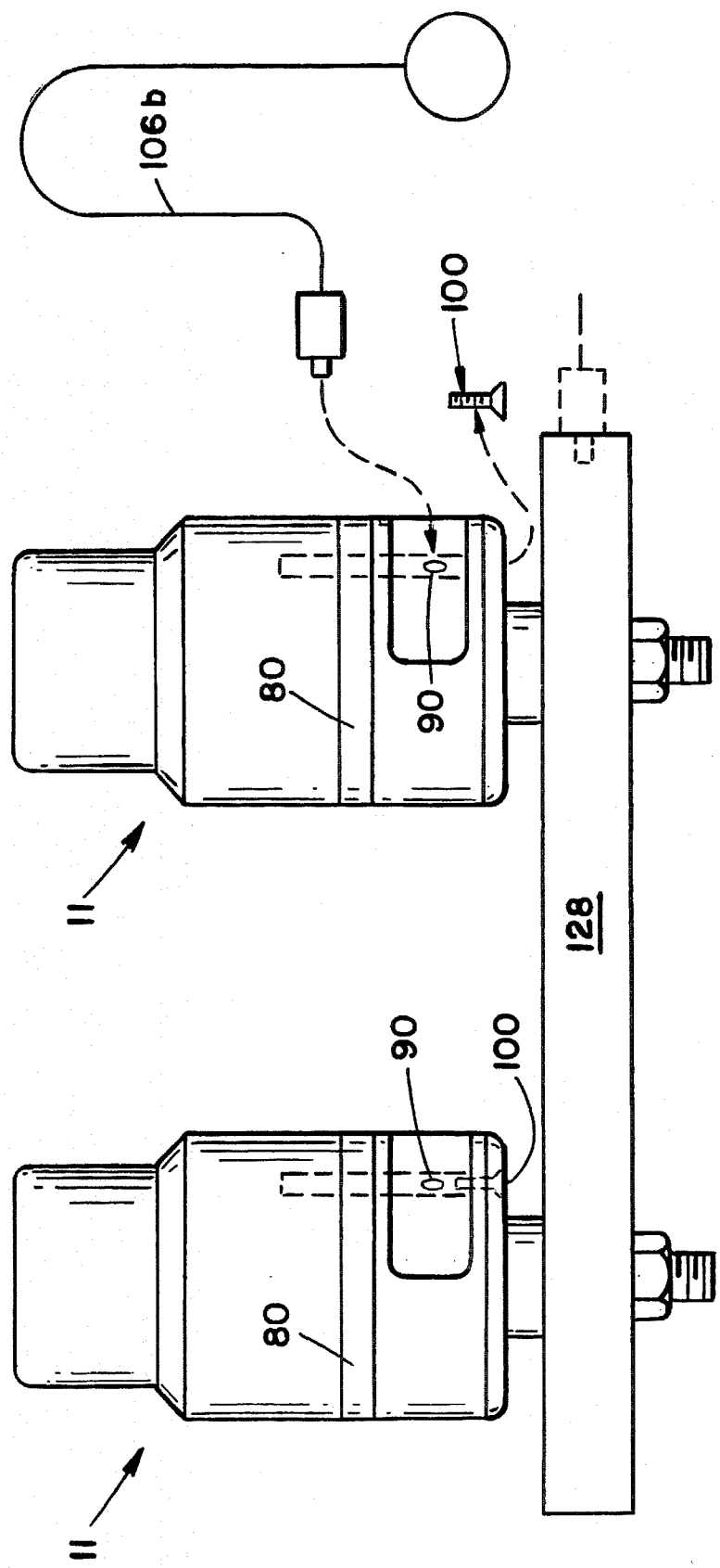
FIG_18

ELECTRIC LIGHT SOCKET CONSTRUCTIONS

CROSS REFERENCE TO RELATED APPLICATION

This application is a continuation-in-part of my copending U.S. patent application Ser. No. 07/719,355. filed Jun. 24, 1991 now U.S. Pat. No. 5,208,516 and being entitled "Touch Controlled Electric Light Socket with High Current Tolerance."

TECHNICAL FIELD

This invention relates to components for electrical light installations and more particularly to light sockets for engaging and energizing light bulbs or the like.

BACKGROUND OF THE INVENTION

Certain characteristics of the more economical forms of electrical light socket make the sockets incompatible with high wattage light bulbs. Other characteristics complicate the process of connecting power wiring with the socket during installation. The switching or power control components of the prior light sockets have been restricted to certain specific types and do not provide for a desirably broad range of different modes of control.

The limitation on the wattage of the bulbs which are used with such sockets is caused by the heat which is produced by light bulbs. Sockets of the above discussed kind have contacts, conductors and insulative materials that have a low tolerance for heat. Consequently, such sockets have been considered to be unsuitable for use with high wattage light bulbs which generate relatively large quantities of heat. Sockets of the more common kinds are typically limited to use with bulbs operating at 150 watts or less. The wattage limit drops to about 100 watts if the installation requires that the bulb and socket be inverted.

Problems arising from the need to avoid heat damage are aggravated in the case of light sockets which include electronic circuit components for the purpose of controlling a lamp or light fixture. Typically, such components may have a maximum temperature tolerance of about 80° C. Such components produce heat when conducting current and this must be dissipated in order to avoid a damaging temperature build-up. Conventional heat sink arrangements for solid state circuit components may be inadequate in this context, particularly if a high wattage bulb is engaged in the socket and is also producing heat.

Thus an economical light socket construction which more effectively dissipates heat would be highly advantageous.

Installation of some forms of light socket requires connection of a lamp cord or other power conductor to terminals of the socket. The power terminals should be inside the socket or be enclosed in some other manner for safety reasons. Access to the power terminals for the purpose of making or repairing such connections is undesirably difficult in prior light sockets. Arrangements for preventing accidental exposure of power terminals, for preventing misconnection of wires and for preventing short circuits between stranded wires in the vicinity of the power terminals are often less effective than would be desirable.

Sockets often include switching means for turning a lamp or light fixture on or off and in some cases for varying the intensity of the light which is produced by the lamp or fixture. Mechanical switches have in some cases been replaced with electronic switch circuits which respond to touching of the socket or some component of the lamp or fixture which is in electrical contact with the socket. Prior sockets which have such self contained electronic switching means control only the single light bulb which is engaged in the socket. It would be advantageous if the socket could, optionally, be used to control additional bulbs in additional sockets or to respond jointly with additional sockets to touching of a single element.

Prior touch controlled sockets of the above described kind are unsuitable for use at elevated locations that can not be conveniently reached by an operator. This has had the effect of restricting usage of such sockets at locations where they might otherwise be the preferred type of socket.

Prior sockets containing electronic switching means respond only to touch and are incapable of responding to more than one mode of actuation. It would be advantageous to provide such sockets with the capability of responding to two or more types of actuation such as touch, loud noises, changes in daylight, high temperature or intrusion of a person into a room, for example.

The present invention is directed to overcoming one or more of the problems discussed above.

SUMMARY OF THE INVENTION

In one aspect, the invention provides an electric light socket for engaging and energizing a light bulb, the socket having a housing adapted for attachment to a support and having a receptacle for receiving the base of said bulb. The housing further has an interior chamber and at least a first and a second airflow opening which openings enable a thermally induced airflow into and out of the chamber along an airflow path which extends between the openings. The socket includes a component which exhibits a temperature during operation that is higher than the temperature of the airflow which enters the first opening. An airflow enhancing thermal conductor in the housing extends form the region of the high temperature component to a location in the housing that is adjacent the airflow path. The airflow is enhanced by heat transfer from the thermal conductor to the airflow at that location. The enhanced airflow lowers the temperature of components of the socket.

In another aspect, the invention provides an electric light socket for engaging and energizing a light bulb and includes a housing adapted for attachment to a support and which has a receptacle for receiving the base of the bulb, the receptacle having contacts for supplying electrical voltage to the bulb. The housing has an interior power terminal chamber and at least a pair of spaced apart power terminals in the chamber for receiving voltage from an external source. Access means enable selective opening and closing of a passage which communicates with the chamber.

In another aspect the invention provides an electrical light socket having a housing with a receptacle for receiving the base of a light bulb, contacts in the receptacle for transmitting voltage to the bulb and a connector for attaching the housing to a support. A touch responsive control circuit in the housing has an input terminal and means for controlling the bulb in response to changes of electrical state at the input terminal. A flexible electrically conductive cord extends outward from the housing and has a first end which is electrically connected to the input terminal enabling the light socket to be touch controlled from a location that is remote from the housing.

In another aspect, the invention provides a lighting fixture of the type which is controlled by electrical control signals.

The fixture includes a plurality of light sockets each having a housing with a receptacle for receiving the base of a light bulb, electrical contacts in the receptacle for transmitting voltage to the bulb, a control signal input within the housing and means for controlling the bulb in response to changes of electrical state at the control signal input. An electrical conductor extends between the plurality of light bulbs. The fixture further includes control option means for optionally and independently connecting the control signal inputs of selected ones of the light sockets with the electrical conductor whereby the sockets may optionally be jointly controlled or be independently controlled.

In still another aspect, the invention provides an electric light socket for engaging and energizing a light bulb which socket has a housing adapted for attachment to a support, a receptacle in the housing for receiving the base of the bulb and contacts in the receptacle for supplying electrical voltage to the bulb. A control circuit in the housing has a control signal input terminal and a solid state component which controls current flow to the contacts in response to control signals which are received at the input. A thermally conductive heat sink member has a first portion which contacts the solid state component and which receives heat from the component and a second portion which extends away from the component to a location at which the heat sink member contacts the support when the housing is attached to the support.

Certain aspects of the invention enable safe and reliable use of high wattage light bulbs in light sockets which can be economically manufactured by enabling and inducing a flow of air within the socket. Other aspects simplify wiring of light sockets while providing a construction which reliably prevents inadvertent exposure of power terminals and which inhibits wiring errors that commonly occur in prior sockets. Still other aspects of the invention provide socket constructions which enable a greater variety of different methods of control in sockets of the type which have internal components for performing switching operations and/or light intensity control operations.

The invention, together with further aspects and advantages thereof, may be further understood by reference to the following description of preferred embodiments and by reference to the accompanying drawings.

BRIEF DESCRIPTION OF THE DRAWINGS

FIG. 1 is a side view of a light socket in accordance with a first embodiment of the invention, the light socket being shown installed on a lamp base and with a light bulb engaged in the socket.

FIG. 2 is an exploded view of the first embodiment showing components in a disassembled condition.

FIG. 3 is an enlarged side view of the first embodiment of the light socket shown partially as a section view.

FIG. 4 is a cross section view taken along line 4—4 of FIG. 3.

FIG. 5 is a section view of a portion of the first embodiment taken along line 5—5 of FIG. 4.

FIGS. 6A and 6B are perspective views depicting opening and closing of a power terminal chamber of the device of the preceding figures.

FIG. 7 is a schematic circuit diagram illustrating electrical components and interconnections of the first embodiment.

FIG. 8 is an elevation section view of a second embodiment of the invention which is adapted for engagement with a pre-existing light socket in a lamp or other lighting fixture.

FIG. 9 is an exploded view of the second embodiment showing the components thereof in a disassembled condition.

FIG. 10 is a side view of a third embodiment of the invention which is a touch controlled light socket that may be operated from a remote location.

FIG. 11 is a side view of a fourth embodiment of the invention shown partially as a section view.

FIG. 12 is a broken out section view of the fourth embodiment taken along line 12—12 of FIG. 11.

FIG. 13 is an exploded view of the fourth embodiment showing components in a disassembled condition.

FIG. 14 is a broken out elevation view of a fifth embodiment of the invention.

FIG. 15 is a section view of the fifth embodiment taken along line 15—15 of FIG. 14.

FIG. 16 is a broken out elevation view of a sixth embodiment of the invention.

FIG. 17 is a section view of the sixth embodiment taken along line 17—17 of FIG. 16.

FIG. 18 is an elevation view of a multi-bulb light fixture embodying the invention.

DETAILED DESCRIPTION OF THE PREFERRED EMBODIMENTS

Referring initially to FIG. 1 of the drawings, an electric light socket 11 in accordance with this embodiment of the invention has a casing or housing 12 which receives the base of a light bulb 13 and which is adapted for attachment to a support 14. The support 14 in this example is the upper end of a table lamp base which may be of conventional construction but it should be recognized that the light socket 11 is also usable with other forms of lamp or lighting fixture including wall mounted fixtures or overhead fixtures.

As will hereinafter be described in more detail, housing 12 contains a control circuit 16 for turning the lamp 17 on and off and for adjusting the intensity of the light which is produced by the lamp. In this particular example, the control circuit 16 is of the known type that responds to the touch of a person's finger although circuits which respond to other forms of input signal may also be used. In this example, the bulb 13 may be turned on by touching metallic portions 18 of the lamp 17 that are in contact with the base 19 of socket 11 or by touching the socket base itself. In this embodiment, the metallic portions 18 include a decorative metal cap 21 at the top of lamp base 14 and the metal harp 22 which is clamped between the lamp base and the socket base 19 for the purpose of supporting a lampshade (not shown). Other lamp or lighting fixture designs may have other forms of metallic surfaces that will serve the same purpose or such a surface can be provided as a component of the light socket 11 itself.

Control circuit 16 includes a triac or other solid state switch component 23 through which voltage is transmitted to the bulb 13. To avoid heat damage to the switch component 23 and to thereby enable use of very high wattage bulbs 13, socket 11 includes a metallic, thermally conductive heat sink member 24. The heat sink member 24 has an 10 arm 26 that contacts switch component 23 to receive heat from the component and has a disk like enlarged region 27 that forms the base 19 of the light socket 11. Thus the member 24 transfers heat to the socket base 19 and adjacent support 14 where it is dissipated to the surrounding atmosphere by conduction, convection and radiation.

To maximize heat transfer, the switch component 23 is preferably fastened directly to heat sink member 24 by a metal bolt or screw 25.

As will be further described, the heat sink member 24 of this embodiment of the invention also serves to connect the metallic portions 18 of lamp 17 to control circuit 16 and thus is a component of the touch sensing system. The member 24 of this embodiment is also the connector through which the socket 11 is attached to support 14. Use of the member 24 for these multiple purposes results in a simple and economical construction of the socket 11 as a whole.

Considering the construction of the light socket 11 in more detail, with reference jointly to FIGS. 2 and 3, housing 12 is formed by a first housing member 28 which is joined in end to end relationship with a second or base housing member 29 by adhesive 31 in this example, one end of the first member being overlapped with the adjacent end of the second member in the region of the adhesive joint. The first housing member 28 is essentially of hollow tubular configuration except that a transverse partition 32 in the member forms the base of a light bulb receiving receptacle 33 and, in conjunction with the second housing member 29, defines a first interior chamber 34 in which components of the control circuit 16 are disposed. The circuit 16 components, with the exception of the triac 23 that transmits A.C. voltage to the bulb, are preferably mounted on a circuit board 36 which seats in a conforming recess 37 in the second housing member 29 and which is secured to member 29 by adhesive or other means.

Bulb receptacle 33 may be of conventional configuration and thus includes an annular threaded neutral contact 38 secured within a cylindrical recess 39 at the end of housing member 28 and a disk-like center or hot contact 41 at the center of the base of the recess. An electrically conductive bolt 42 extends through partition 32 and downward into the lower region of base housing member 29 to connect neutral contact 38 to a neutral power terminal which will be hereinafter described and a short hollow rivet 43 extends through the partition to provide for an electrical connection to hot contact 41 which will also be hereinafter described. One or more additional contacts can be provided in receptacle 33 in the known manner if the light socket 11 is to be adapted for use with multiple filament light bulbs.

The disk shaped region 27 of heat sink member 24 seats in a conforming recess 44 in the base of the second housing member 29. Arm 26 of the heat sink member extends into the first housing chamber 34 through a slot 49 in second housing member 29 that is located near the sidewall of the member. The triac 23 through which A.C. voltage is transmitted to contact 41 is disposed in first chamber 34 in contact with arm 26 and is secured to the arm by the previously described thermally conductive bolt or screw 25. Heat sink member 24 is secured in place by a bolt 52 which extends into second housing member 29 and which engages in a threaded passage 54 in the arm.

Referring again to FIG. 1, lamp bases of the type that this embodiment of the invention is designed for have a tubular threaded shaft 56 for securing a light socket to the lamp and the A.C. power conductors 57 and 58 for energizing the socket extend within the shaft and out of the end of the shaft. Referring jointly to FIGS. 1 and 3, the base of heat sink member 24 has an annular boss 59 with an internally threaded bore 61. The threaded bore 61 and a set screw 60 provide for fastening of the light socket 11 to lamp base 14 by engaging the boss on shaft 56.

Referring to FIGS. 3, 4 and 5 in conjunction, housing 12 has a second interior chamber 62 in the form of a transverse slot which extends across the second housing member 29. The lower ends of a pair of A.C. power terminals 63 and 64 are situated in recesses 67 which are at opposite ends of chamber 62 and at opposite sides of the chamber. Terminals 63 and 64 extend upward, as may be seen in FIG. 2, to provide for circuit connections which will herein-after be described. Referring again to FIGS. 3, 4 and 5, threaded screws 66 provide for connection of A.C. power wires to the terminals 63 and 64 and are accessible from opposite ends of chamber 62.

The disposition of the power terminal screws 66 at oppositely facing surfaces at opposite ends of chamber 62 prevents inadvertent short circuiting of the terminals during installation by stray strands of stranded wire.

Referring jointly to FIGS. 1 and 3, an opening 68 in housing member 29 is aligned with the threaded passage 61 of heat sink member 24. This enables entry of the A.C. power conductors 57 and 58 into housing chamber 62 for connection to power terminals 63 and 64.

To prevent inadvertent entry of an operator's finger or other objects into the power terminal chamber 62, an annular turnable closure or cover 69 encircles the second housing member 29. A flange 71 at the base of member 29 and the adjacent edge 72 of first housing member 28 prevent axial displacement of closure 69. Referring to FIGS. 3, 4 and 5, cover 69 has openings 73 at diametrically opposite locations. Openings 73 are turned into register with chamber 62, as shown in FIG. 6A, when access to the power terminals 63 and 64 is needed. Cover 69 may then be rotated to a closed position, depicted in FIG. 6B, at which both ends of the chamber 62 are covered.

Referring again to FIGS. 3, 4 and 5, locking means 74 are provided to prevent turning of closure 69 away from the position at which the ends of power terminal chamber 62 are covered except when deliberate action is taken with the aid of a tool. Means 74 in this example includes a small slidable plunger 76 disposed in a passage 77 in second housing member 29 and which has a pin 78 at the outer end which enters an aperture 79 in closure 69 when the closure is at the closed position. A compression spring 81 in passage 77 urges the plunger 76 into aperture 79. Plunger 76 may be retracted from aperture 79, to enable access to chamber 62, by forcing a small nail or the like into the aperture.

Housing members 28 and 29 and closure 69 are preferably formed of molded plastic. To facilitate control of the socket 11 by direct touching of the socket, a thin band 80 of conductive metal encircles the upper portion of closure 69 and is secured thereto. The touch signal input terminal of control circuit 16 is a metallic tube 83 having a lower end situated over the disk shaped region 27 of of heat sink member 24, in spaced apart relationship, and which extends up to the control circuit chamber 34. Terminal 83 is placed in electrical contact with band 80 by an elongated screw 85 which extends from the terminal to the inner end of spring 81 within second housing member 29. Plunger 76 including pin 78 is formed of electrical conductor and thus the pin, plunger, spring 81 and screw 85 jointly form a conductive path from band 80 to the touch signal input terminal 83.

A small passage 90 extends into the sidewall of housing member 29 and into terminal 83. A removable control option screw 100 of conductive metal extends upward from the underside of heat sink member 24 and engages in the lower end of terminal 83. The passage 90 and screw 100 enable methods of controlling the light socket 11 which will hereinafter be described.

Referring to FIG. 7 which depicts electrical interconnections between the above described components, triac 23 and light bulb receptacle contacts 41 and 42 are connected in series across power terminals 63 and 64 to receive utility alternating current which is represented by waveform 82 in the drawing. As previously described, touch signal input terminal 83 is electrically connected with touch band 80 and, via control option screw 100, with heat sink member 24. Terminal 83 provides control signals to a touch responsive dimmer circuit 84 which transmits cyclical gating pulses to triac 23.

In general, circuits 84 of this kind operate by sensing the charge fluctuation which occurs when a person's finger touches an electrical conductor that is connected to the input terminal 83. Band 80, heat sink member 24 and such metallic portions 18 of the lamp that are in contact with the member are conductors of this kind in the present example. Triacs 23 and certain other gate controlled solid state switch components cease conducting at the end 85 of each half cycle of the applied alternating current 82 and do not resume conducting until a gate or trigger pulse 86 is received. Dimmer circuit 84 varies the timing of the trigger pulse 86 during each half cycle of the alternating current 82 in response to successive sensed touches to increase the electrical power that is being applied to light bulb 13 in response to each successive touch until full power is being delivered. Circuit 84 stops transmitting power in response to the next touch and thereby turns the light bulb 13 off. Cycling through the several levels of brightness resumes in response to the following touch.

Dimmer circuit 84 has not been described in detail as it may be of one of the known forms. Prior U.S. Pat. No. 3,715,623, which is hereby incorporated by reference, discloses details of one such circuit which is suitable for the present purpose. U.S. Pat. Nos. 4,163,923 and 4,211,959 also disclose circuits of this kind. As a practical matter, circuits of this kind are commercially available in integrated circuit form. The present embodiment utilizes an HI-2410 Capacitive Touch Light Dimmer integrated circuit as manufactured by Holt Integrated Circuits, Inc., Irvine, Calif. Another commercially available circuit which may be used is a LS 7232 Touch Control Continuous Dimmer Light Switch manufactured by LSI/CSI Company, Melville, N.Y.

The above described embodiment of the invention is designed to be substituted for or to replace older types of socket. Referring jointly to FIGS. 8 and 9, the invention may also be embodied in a supplemental light socket 11a designed to engage in the pre-existing socket 90 of a lamp 95 or other lighting fixture, which supplemental sockets are sometimes called adapters. The term "light socket" as used herein and in the appended claims should be understood to refer to devices of either type.

Socket 11a of this embodiment of the invention is characterized by an induced airflow through the socket that very efficiently removes heat from the base of the bulb and from control electronics in the housing if present.

Socket 11a has a housing 12a formed by two housing members 28a and 29a secured together in end to end relationship and a light bulb engaging receptacle 33a is secured within the outer end of the first housing member 28a. Receptacle 33a includes a first pair of contacts 38a and 41a which may be similar to the corresponding components of the first described embodiment. The first housing member 28a has a chamber 34a below receptacle 33a in which a circuit board 36a, carrying the components of control circuit 16a, is disposed. The control circuit 16a including a triac 23a through which alternating current is transmitted to contacts 38a and 41a may also be similar to their counterparts in the first described embodiment.

The second housing member 29a is formed with an annular recess 87 which extends inward from the end of the member that is opposite from the first member 28a and which encircles a cup shaped central portion 88 of the housing member 29a. Connection of the supplementary light socket 11a to another light socket is provided for by a metal sleeve 89 which is secured to portion 88 in coaxial relationship with the portion 88. Sleeve 89 has a diameter conforming to that of the base of a standard light bulb and has threads 91 similar to those of a light bulb thereby enabling the supplementary light socket to be screwed into the socket 90 of lamp 95. Sleeve 89 and a conductive disk 92 at the end of portion 88 constitute a second pair of contacts for receiving alternating current from the other socket 90.

As in the first described embodiment, the triac 23a of the control circuit 16a is secured to a thermally and electrically conductive heat sink member 24a which transfers heat away from the triac and also provides an electrically conductive path between the control circuit input terminal 83a and conductive surfaces of the lamp 95 which surfaces typically include a cylindrical metallic casing 101 which encircles the socket 90 of the lamp 95.

Heat sink member 24a has an annular end portion 93 which seats on the top of the cup shaped central portion of the housing member 29a. A tab 94 portion of the heat sink member 24a extends down from end portion 93 into the cup shaped portion 88 and has a U-shaped end which clamps the triac 23a to conduct heat away from the triac. The heat sink member 24a also has a plurality of fingers 97 which extend downward from end portion 93 within recess 87 in position to contact the metal casing 101 which supports the light socket 90 of lamp 95.

Fingers 97 are equiangularly spaced around the annular end portion 93 of the heat sink member 24a and the midsection 102 of each finger is angled inwardly towards the central axis of the member. The heat sink member including fingers 97 is formed of a resilient material such as copper or aluminum and the angled midsections 102 of the fingers are positioned to be deflected apart slightly by the light socket casing 101 of lamp 95 thereby assuring good thermal and electrical contact with the casing. Below the midsection 102, each finger 97 extends into one of a series of vertical grooves 103 in the wall of recess 87. The region of each groove 103 that is outward from the wall of recess 87 is broader than the region that is adjacent the recess wall and the tip 104 of each finger is also broader than the inner region. Thus the groove 103 configuration holds the tips 104 within the grooves.

The heat sink member 24a of this embodiment conducts heat from the region of triac 23a to the metal casing 101 of the lamp socket 90 but it is not essential in all cases that the member contact casing 101 as another and highly effective cooling process occurs in the socket 11a. In particular, a thermally induced flow of air occurs within the socket 11a.

The airflow path in this embodiment begins at grooves 103 and extends upward within the socket 11a to the region between the bulb engaging receptacle 33a and the portion 105 of upper housing member 28a that encircles the receptacle. The threads 38a of receptacle 33a create an airflow outlet in instances where the receptacle abuts housing portion 105 but preferably the portion 105 has an inside diameter that is slightly greater than the outside diameter of the receptacle in order to provide a more sizable flow passage. Openings 110 may be provided in circuit board 36a in instances where the board would otherwise block the airflow. The airflow passes through the tubular contact rivets 41a and 42a in this embodiment but openings may also be provided through the housing 28a material at the base of receptacle 33a in instances where such rivets are not present.

Additional airflow openings 113 are preferably provided in the side wall of housing 12a at locations above the lower ends of the air inlet grooves 103. Such openings 113 are at a lower portion of housing 12a in this example and function as supplementary air intakes. Such openings 113 will function as airflow outlets in embodiments in which there is no airflow passage from the lower region of housing member 28a into the receptacle 33a region of the member.

At the minimum, the housing should have at least a first and a second airflow opening which openings are preferably vertically spaced apart.

Heating of the air within socket 11a causes it to rise thereby generating the airflow. The flow is enhanced by heat sink member 24a which conducts heat to the relatively cool air which enters grooves 103 and efficiently transfers heat to such air.

Operation of the light socket 11a is otherwise similar to that the first described embodiment except insofar as the heat sink member 24a does not also function as the connector which attaches the socket 11a to a support.

The cooling airflow inducing structure described above is not limited to sockets 11a which include electronic control components such as triac 23a. In sockets which lack such controls, the heat sink member may extend to some other relatively high temperature component such as receptacle 33a.

The hereinbefore described embodiments of the invention are actuated and deactuated by touching some metallic portion of the lamp or light fixture that is in electrical contact with the heat sink members. In instances where the lamp does not have a conveniently accessible conductive surface, one end of a short length of electrically conductive wire or cord 106 may be connected to the heat sink member 24a by means of a screw 107. Thus the lamp 95 may be operated by touching the distal end 109 of the cord 106. Cord 106 preferably has an enlargement 111 at the distal end 109 to facilitate such touching and to increase the sensitivity of the light socket 11a to such touching.

Referring to FIG. 10, some lamps or lighting fixtures 14b may be situated at an elevated location on a wall 112 or on a ceiling or otherwise be inconvenient to reach. The embodiment of FIG. 10 is provided with a longer conductive cord 106 of the above described kind to enable easy and convenient operation of the lighting fixture 14b. Fixture 14b may otherwise be similar to one of the previously described embodiments and is similar to the first described embodiment in this example.

FIGS. 11, 12 and 13 depict another embodiment of the invention in which the heat sink member 24c does not contact a lamp or another light socket as in the previously described embodiments for the purpose of conducting heat to such external objects. The relatively compact embodiment of FIGS. 11, 12 and 13 avoids overheating by relying on the thermally induced internal airflow.

The socket 11c of this embodiment is of the adapter type in that it is designed to receive the base of a light bulb and to engage in another light socket and contains a touch responsive electronic circuit 16c of the previously described kind for turning the bulb on and off and for varying the intensity of light emitted by the bulb. The socket housing 12c is again formed by an annular upper housing member 28c and lower housing member 29c which is secured to the base of the upper member by adhesive or other means, the housing members preferably being formed of plastic. The open upper end of upper housing member contains a light bulb engaging receptacle 33c formed by an annular threaded neutral contact 38c centered above a hot contact 41c which contacts are secured to a transverse partition 32c within the member and which may be essentially similar to the corresponding components of the previously described embodiment. The lower region of upper housing member 28c forms an interior chamber 34c in which the printed circuit board 36c that carries the control circuit 16c is disposed.

The annular touch band 80c of this embodiment extends around the lower portion of upper housing member 28c and is split into two semi-circular segments 116 and 117 which do not contact each other. Separate conductive pins 118 extend into chamber 34c from each of the touch band segments 116 and 117 to transmit touch signals to the control circuit 16. The split touch band 80c enables use of the band to provide independent control of different functions of the control circuit 16. For example, one segment 116 may be coupled to the portion of circuit 16 which varies light intensity while the other segment 117 is coupled to the portion which turns the light on and off, thereby avoiding the need to cycle through the various light intensity levels when the light is being turned on or off. The split touch band 80c may also be used to enable control of the light by signals from two different sources. For example, one segment may be touch responsive while the other is used to input signals from a daylight sensor, infrared room occupancy sensor, a loud noise detecting microphone or other control device of one of the known forms. The band 80c may be split into a greater number of segments if it is desired to control the light bulb in response to more than two forms of input.

The outer ends of the connector pins 118 are preferably hollow to enable plugging in of a conductive remote control cord of the kind which has been hereinbefore described.

The lower housing member 29c has a flange 119 at its upper end and a downward extending tubular portion 88c. Tubular portion 88c is encircled by a threaded annular metal sleeve contact 89c which is shaped for engagement with another light socket. A conductive disk 92c at the lower end of tubular portion 88c forms the other power input contact.

The heat sink member 24c of this embodiment is a flat metal ring disposed in housing chamber 34c above flange 119 and has a tab 121 which extends downward into the tubular portion 88c of lower housing member 29c. The triac 23c of control circuit 16c is secured to tab 121 by a thermally conductive metal screw 25c.

To provide for a thermally induced airflow within the housing 12c, a first series of air inlet openings 122 are present in the flange 119 of lower housing member 29c, the openings being spaced apart at equiangular intervals around the flange. A ring of spaced apart bosses 123 extend a short distance upward from the upper surface of flange 119 to hold heat sink member 24c in spaced apart relationship with the openings 122 and thereby enable inflow of air. The airflow, which is induced by heat transfer from heat sink member 24c to the adjacent air, travels up through the open center of the member 24c, through a notch opening 123 in circuit board 36c and enters bulb receptacle 33c through one or more of the hollow tubular rivets 41c and 42c which secure contact 36c to partition 32c. The air flow then enters the region between contact 36c and the encircling wall of upper housing member 28c through openings 124 in the side wall of contact 36c and travels up and out of the socket 11c.

Preferably an additional series of air inlets 124 are provided in the side wall of tubular portion 88c of lower housing member 29c.

Any of the above described embodiments of the invention which include provisions for a thermally induced airflow will operate very effectively in an inverted orientation. When so inverted, the direction of the airflow is reversed and openings which have been referred to as inlets become outlets and the above described outlets become inlets. Effective cooling by an induced airflow also occurs if the sockets are operated in a horizontal orientation.

For purposes of example, the invention has been herein described with reference to sockets 11 which have control circuits 16 of the touch responsive type. The touch responsive circuits 16 can be replaced with or supplemented with control circuits of the known forms which respond to other types of input such as loud noises, diminished daylight, infrared signals or other changes in the ambient environment.

Certain aspects of the invention are advantageous in light sockets that do not include control circuits and/or a heat sink member. FIGS. 14 and 15, for example, depict a light socket 11d which is similar to the first described embodiment of FIGS. 1 to 5 except that it does not have an interior chamber for receiving a control circuit. The socket 11d has an upper housing member 28d with a light bulb engaging receptacle 33d which is similar to the corresponding components of the first described embodiment except that the member 28d may be more compact in the vertical direction. The lower housing member 29d is similar to the corresponding component of the first described embodiment except that it is not shaped to accommodate to a heat sink member. The boss 59d at the base of the socket is in this case an integral portion of the lower housing member 29d. Thus socket 11d has an interior wiring chamber 62d within which the power terminals 63d, 64d are situated, an annular turnable closure 69d with chamber access openings 73 and locking means 74d which hold the closure at the closed position until deliberate actions are taken with the aid of an implement, which components may be identical to the corresponding components of the first described embodiment. Thus socket 11d provides the advantages of convenient wiring, safety and safeguards against mis-wiring that are provided by the other embodiments.

As has been previously described, disposition of the power terminals 63d and 64d in offset passages 67 at opposite side regions of the socket acts to prevent inadvertent short circuits during wiring process by isolating the terminals from each other. This requires that the socket be accessible from two opposite sides and there may be instances where this is not convenient or practical. FIGS. 16 and 17 depict an alternate configuration which can be wired from one side only. The interior chamber 62e in which the power terminals 63e and 64e are situated does not extend all the way across the lower housing member 29e. The outermost region 126 of chamber 62e has the shape of a sector of a cylinder and the inner region 127 of the chamber is a vertical passage extending upward from the bore 61d in which the lamp base shaft 56e is engaged. The two power terminal screws 63e and 64e are situated at opposite ones of the angled walls of the sector shaped outermost region of chamber 62e. The socket 11e may otherwise be similar to the socket 11d of FIGS. 14 and 15.

Referring again to FIGS. 2 and 3, the previously described control option screw 100 enables selective disconnection of the control circuit input terminal 83 from the heat sink member 24 as the screw can easily be removed for that purpose. This capability enables a number of different modes of control to be realized. With the screw 100 in place, the socket 11 may be controlled by touching touch band 80 or any conductive portion of the lamp itself that is in electrical contact with heat sink member 24. If screw 100 is removed, the socket 11 responds only to touching of band 80.

The versatility of control which is provided by the control option screws 100 is greater in lamps, lighting fixtures or the like which have a plurality of light bulbs 13 each engaged in a separate one of a plurality of light sockets 11. Referring to FIG. 18, the bases of the plural light sockets 11 may be secured to an electrically conductive support 128. If the control option screws 100 of both of the depicted sockets 11 are in place in the sockets, the two sockets may be jointly controlled by touching the touch band 80 of either socket or by touching the support 128. If the screws 100 of both sockets 11 are removed, then the two sockets may be controlled independently of each other by touching the band 80 of one or both sockets. As is actually depicted in FIG. 18, the screw 100 can be removed from a first of the sockets 11 but left in place in the second socket. The first socket can then be independently controlled by touching the touch band 80 of that socket. The second socket 11 may then be independently controlled by touching either the band 80 of that socket or by touching the support 128. This optional interlinking of the controls of the sockets can be extended to include more sockets then are depicted in FIG. 18. Optionally, a conductive remote control cord 106b of the previously described kind can be plugged into the input terminal passage 90 of any or all of the sockets 11 to enable remote control. Alternately, if the screw 100 of at least one of the sockets 11 is in place, the remote control cord 106b may be plugged into support 128.

The embodiments of the invention which are shown in the drawings are proportioned for use with light sockets of the type that is standardized in the United States of America. The proportions and configurations of the light bulb engaging elements and socket engaging elements may be changed as needed in order to be compatible with bulbs and sockets of different size or configuration that are used in other countries.

While the invention has been described with reference to certain specific embodiments for purposes of example, many variations and modifications are possible and it is not intended to limit the invention except as defined in the following claims.

I claim:

1. An electric light socket for engaging and energizing a light bulb comprising:

a housing adapted for attachment to a support and having a receptacle for receiving the base of said light bulb which receptacle has contacts for supplying electrical voltage to said light bulb, said housing having an interior power terminal chamber with power thermal access and at least a pair of spaced apart power terminals therein for receiving said voltage from an external source, further including access means for selectively opening and closing a passage which communicates with said interior power terminal chamber, wherein said housing has a sidewall and said passage is an access opening therein that communicates with said interior power terminal chamber, and wherein said access means for selectively opening and closing a passage which communicates with said interior power terminal chamber includes a movable closure at said sidewall which movable closure is shiftable from a first position at which said access opening is exposed and a second position at which said access opening is covered.

2. The apparatus of claim 1 wherein said movable closure is a rotatable annular sleeve encircling said housing in the region of said interior power terminal chamber, said rotatable annular sleeve having at least one open area and being rotatable relative to said housing between a first position at which said at least one open area is in register with said access opening and a second position at which said rotatable annular sleeve covers said access opening.

3. An electric light socket for engaging and energizing a light bulb comprising:

a housing adapted for attachment to a support and having a receptacle for receiving the base of said light bulb which receptacle has contacts for supplying electrical voltage to said light bulb, said housing having an interior power terminal chamber and at least a pair of spaced apart power terminals therein for receiving said voltage from an external source, further including access means for selectively opening and closing a passage which communicates with said interior power terminal chamber, wherein said housing has a sidewall and said passage is an access opening therein that communicates with said interior power terminal chamber, and wherein said access means for selectively opening and closing a passage which communicates with said interior power terminal chamber includes a movable closure at said sidewall which movable closure is shiftable from a first position at which said access opening is exposed and a second position at which said access opening is covered, wherein said movable closure is a rotatable annular sleeve encircing said housing in the region of said interior power terminal chamber, said rotatable annular sleeve having at least one open area and being rotatable relative to said housing between a first position at which said at least one open area is in register with said access opening and a second position at which said rotatable annular sleeve covers said access opening, further including locking means for preventing inadvertent rotation of said rotatable annular sleeve away from said second position thereof.

4. An electric light socket for engaging and energizing a light bulb comprising:

a housing adapted for attachment to a support and having a receptacle for receiving the base of said light bulb which receptacle has contacts for supplying electrical voltage to said light bulb, said housing having an interior power terminal chamber and at least a pair of spaced apart power terminals therein for receiving said voltage from an external source, further including access means for selectively opening and closing a passage which communicates with said interior power terminal chamber and wherein said housing has a sidewall and said passage is an access opening therein that communicates with said interior power terminal chamber, and wherein said access means includes a movable closure at said sidewall which movable closure is shiftable from a first position at which said access opening is exposed and a second position at which said access opening is covered, wherein said movable closure is a rotatable annular sleeve encircling said housing in the region of said interior power terminal chamber, said sleeve having at least one open area and being rotatable relative to said housing between a first position at which said at least one open area is in register with said access opening and a second position at which said sleeve covers said access opening, further including locking means for preventing inadvertent rotation of said sleeve away from said second position thereof, wherein said movable closure has an aperture therein and wherein said housing has a passage which is in register with said aperture when said movable closure is at said second position thereof and wherein said locking means includes a slidable member in said passage, said slidable member having an end adapted to enter said passage and prevent turning of said movable closure, and resilient means for urging said end of said slidable member into said aperture.

5. The apparatus of claim 4 wherein said aperture is too small to permit entry of a human finger therein.

6. An electric light socket for engaging and energizing a light bulb comprising:

a housing adapted for attachment to a support and having a receptacle for receiving the base of said light bulb which receptacle has contacts for supplying electrical voltage to said light bulb, said housing having an interior power terminal chamber and at least a pair of spaced apart power terminals therein for receiving said voltage from an external source, further including access means for selectively opening and closing a passage which communicates with said interior power terminal chamber, wherein said housing has a sidewall and said passage is an access opening therein that communicates with said interior power terminal chamber, and wherein said access means includes a movable closure at said sidewall which movable closure is shiftable from a first position at which said access opening is exposed and a second position at which said access opening is covered, wherein said movable closure is a rotatable annular sleeve encircling said housing in the region of said interior power terminal chamber, said sleeve having at least one open area and being rotatable relative to said housing between a first position at which said at least one open area is in register with said access opening and a second position at which said sleeve covers said access opening, wherein said interior power terminal chamber of said housing has a slot which extends transversely across said housing between opposite areas of said sidewall thereof to provide access openings at each of said opposite areas, which slot has a recess adjacent each of said opposite sidewall areas that is offset laterally from the central region of said slot, each of said power terminals being within a separate one of said recesses, and wherein said sleeve has a pair of said open areas which open areas are at diametrically opposite locations on said sleeve.

7. An electric light socket for engaging and energizing a light bulb comprising:

a housing adapted for attachment to a support and having a receptacle for receiving the base of said light bulb which receptacle has contacts for supplying electrical voltage to said light bulb, said housing having an interior power terminal chamber and at least a pair of spaced apart power terminals therein for receiving said voltage from an external source, further including access means for selectively opening and closing a passage which communicates with said interior power terminal chamber, wherein said housing has a sidewall and said passage is an access opening therein that communicates with said interior power terminal chamber, and wherein said access means includes a movable closure at said sidewall which movable closure is shiftable from a first position at which said access opening is exposed and a second position at which said access opening is covered, wherein said movable closure is a rotatable annular sleeve encircling said housing in the region of said interior power terminal chamber, said sleeve having at least one open area and being rotatable relative to said housing between a first position at which said at least one open area is in register with said access opening and a second position at which said sleeve covers said access opening, and wherein said interior power terminal chamber of said housing has an outer region adjacent said sleeve that has divergent side surfaces, each of said power terminals being secured to a separate one of said divergent side surfaces.

8. An electric light socket for engaging and energizing a light bulb comprising:

a housing adapted for attachment to a support and having a receptacle for receiving the base of said light bulb which receptacle has contacts for supplying electrical voltage to said light bulb, said housing having an interior power terminal chamber with power terminal access and at least a pair of spaced apart power terminals therein for receiving said voltage from an external source, further including access means for selectively opening and closing a passage which communicates with said interior power terminal chamber, wherein said housing has a sidewall and said passage is an access opening therein that communicates with said interior power terminal chamber, and wherein said access means includes a movable closure at said sidewall which movable closure is shiftable from a first position at which said access opening is exposed and a second position at which said access opening is covered, wherein said movable closure is a rotatable annular sleeve encircling said housing in the region of said chamber, said sleeve having at least one open area and being rotatable relative to said housing between a first position at which said at least one open area is in register with said access opening and a second position at which said sleeve covers said access opening, and wherein said receptacle is at a first end of said housing and wherein the opposite end of said housing has a threaded passage extending therein which passage communicates with said interior power terminal chamber.

9. An electric light socket for engaging and energizing a light bulb, said electric light socket having a housing with power terminal access adapted for attachment to a support, a receptacle in said housing for receiving the base of said light bulb, contacts in said receptacle for supplying electrical voltage to said light bulb, and a control circuit in said housing which includes a control signal input terminal and a solid state component which controls current flow to said contacts in response to control signals which are received at said control signal input terminal, said housing having a wall which extends around an interior chamber in which said solid state component is situated, wherein the improvement comprises: a thermally conductive heat sink member having a first portion which is situated within said interior chamber of said housing and which contacts said solid state component to receive heat therefrom and having a second portion which extends away from said solid state component to a location at which said heat sink member contacts said support when said housing is attached thereto, said thermally conductive heat sink member and said housing wall being two different components of said electric light socket, said heat sink member being electrically isolated from said contacts.

10. The apparatus of claim 9 wherein said control circuit is touch controlled and wherein said thermally conductive heat sink member is electrically connected to said control signal input terminal whereby said thermally conductive heat sink member serves as a touch sensing component for said control circuit in addition to dissipating heat therefrom.

11. The apparatus of claim 9 wherein said control circuit is touch controlled and wherein said thermally conductive heat sink member is electrically connected to said control signal input terminal and extends to a location at which said thermally conductive heat sink member contacts an electrically conductive region of said support when said housing is fastened thereto whereby said thermally conductive heat sink member and said electrically conductive region of said support function as touch sensing components of said control circuit.

12. The apparatus of claim 9 wherein said solid state switch element is secured to said heat sink member by a thermally conductive fastener and is supported by said thermally conductive heat sink member.

13. An electric light socket for engaging and energizing a light bulb, said socket having a housing with power terminal access adapted for attachment to a support, a receptacle in said housing for receiving the base of said light bulb, contacts in said receptacle for supplying electrical voltage to said light bulb, and a control circuit in said housing which includes a control signal input terminal and a solid state component which controls current flow to said contacts in response to control signals which are received at said input, wherein the improvement comprises:

a thermally conductive heat sink member having a first portion which is situated within said housing and which contacts said solid state component to receive heat therefrom and having a second portion which extends away from said solid state component to a location at which said heat sink member contacts said support when said housing is attached thereto, said thermally conductive heat sink member and said housing being two different components of said electric light socket, and wherein said light bulb receiving receptacle is situated at a first end of said housing and wherein said heat sink member extends to the opposite end of said housing and has an enlarged region thereat and a threaded passage in said enlarged region for engaging a threaded portion of said support whereby said heat sink member serves as a connector for attaching said housing to said support.

14. The apparatus of claim 9 wherein said receptacle is situated at a first end of said housing, further including a connector situated at the opposite end of said housing for attaching said housing to said support, said connector being a threaded element adapted to engage in the receptacle of a second electrical light socket and having contact means for transmitting electrical current from said second electrical light socket to said control circuit, and wherein said thermally conductive heat sink member extends to a location at said opposite end of said housing at which said thermally conductive heat sink member contacts an exterior surface of said second electrical light socket when said connector is engaged therewith.

15. The apparatus of claim 14 wherein said thermally conductive heat sink member is formed of resilient material and is positioned to be flexed by contact with said exterior surface of said second electrical light socket as said connector is being engaged therewith.

16. The apparatus of claim 14 wherein said thermally conductive heat sink member has a plurality of metallic fingers which are angularly spaced apart around said connector and radially spaced from said connector in position to contact said exterior surface of said second electrical light socket as said said connector is being engaged therewith, said thermally conductive heat sink member being electrically connected to said input terminal of said control circuit.

17. The apparatus of claim 9 wherein said control circuit is touch controlled further including a flexible electrically conductive cord having a conductive connection to said input terminal of said control circuit and which extends away from said housing and having a distal end which may be touched to operate said control circuit, said conductive cord being electrically isolated from said contacts.

18. The apparatus of claim 17 further including an enlargement at said distal end of said flexible electrically conductive cord.

19. An electric light socket for engaging and energizing a light bulb, said socket having a housing adapted for attachment to a support, a receptacle in said housing for receiving the base of said light bulb, contacts in said receptacle for supplying electrical voltage to said light bulb, and a control circuit in said housing which includes a control signal input terminal and a solid state component which controls current flow to said contacts in response to control signals which are received at said control signal input terminal, wherein the improvement comprises:

a thermally conductive heat sink member having a first portion which is situated within said housing and which contacts said solid state component to receive heat therefrom and having a second portion which extends away from said component to a location at which said heat sink member contacts said support when said housing is attached thereto, wherein said housing has a terminal chamber and at least one access opening communicating therewith, further including a pair of spaced apart power terminals situated in said terminal chamber and being electrically connected to said contacts, means for enabling insertion of current conductors into said terminal chamber for connection to said power terminals, and an annular closure encircling said housing in the region of said terminal chamber, said closure having at least one open area and being turnable relative to said housing between a first position at which said at least one open area is in register with said access opening and a second position at which said closure covers said access opening.

20. An electric light socket for engaging and energizing a light bulb, said socket having a housing adapted for attachment to a support, a receptacle in said housing for receiving the base of said light bulb, contacts in said receptacle for supplying electrical voltage to said light bulb, and a control circuit in said housing which includes a control signal input terminal and a solid state component which controls current flow to said contacts in response to control signals which are received at said control signal input terminal, wherein the improvement comprises:

a thermally conductive heat sink member having a first portion which is situated within said housing and which contacts said solid state component to receive heat therefrom and having a second portion which extends away from said component to a location at which said heat sink member contacts said support when said housing is attached thereto, wherein said housing has a terminal chamber and at least one access opening communicating therewith, further including a pair of spaced apart power terminals situated in said terminal chamber and being electrically connected to said contacts, means for enabling insertion of current conductors into said terminal chamber for connection to said power terminals, and an annular closure encircling said housing in the region of said terminal chamber, said closure having at least one open area and being turnable relative to said housing between a first position at which said at least one open area is in register with said access opening and a second position at which said closure covers said access opening, and wherein said annular closure has an aperture therein and wherein said housing has a passage which is in register with said aperture when said closure is at said second position thereof, further including a slidable plunger in said passage, said plunger having an end adapted to enter said aperture and prevent turning of said annular closure, and resilient means for urging said plunger into said aperture.

\* \* \* \* \*